United States Patent [19]

Pascucci et al.

[11] Patent Number: 5,321,317
[45] Date of Patent: Jun. 14, 1994

[54] ZERO-CONSUMPTION POWER-ON RESET CIRCUIT

[75] Inventors: Luigi Pascucci, Sesto S. Giovanni; Marco Olivo, Bergamo, both of Italy

[73] Assignee: SGS-Thomson Microelectronics S.r.l., Agrate Brianza, Italy

[21] Appl. No.: 936,857

[22] Filed: Aug. 27, 1992

[30] Foreign Application Priority Data

Aug. 30, 1991 [IT] Italy .................. VA91 A 0026

[51] Int. Cl.⁵ ................................. G05F 1/46
[52] U.S. Cl. .................. 307/296.4; 307/592; 307/597
[58] Field of Search .............. 307/296.4, 296.5, 592, 307/594, 597, 303.2

[56] References Cited

U.S. PATENT DOCUMENTS

| | | | |
|---|---|---|---|
| 4,260,907 | 4/1981 | Winebarger | 307/296.4 |
| 4,818,904 | 4/1989 | Kobayashi | 307/296.5 |
| 4,902,907 | 2/1990 | Haga et al. | 307/296.5 |
| 5,039,875 | 8/1991 | Chang | 307/594 |
| 5,103,115 | 4/1992 | Ueda et al. | 307/592 |
| 5,120,993 | 6/1992 | Tsay et al. | 307/296.4 |
| 5,172,012 | 12/1992 | Ueda | 307/597 |
| 5,212,412 | 5/1993 | Atriss et al. | 307/296.4 |
| 5,214,316 | 5/1993 | Nagai | 307/592 |

*Primary Examiner*—John T. Kwon
*Attorney, Agent, or Firm*—Wolf, Greenfield & Sacks

[57] ABSTRACT

A power-on reset circuit, which may be utilized with CMOS integrated circuits, includes first and second series-connected inverters, wherein the output of the second inverter provides a reset signal. A series of switches and a biasing line having two series-connected diodes are integrally arranged with the inverters. Capacitive coupling to ground and the supply voltage is employed to prevent any static current path between supply voltage rails. The circuit provides a short duration reset signal which follows the supply voltage and is insensitive both to rebound signals on the supply voltage rails and to internal and external noise.

32 Claims, 2 Drawing Sheets

ZERO-CONSUMPTION POWER-ON RESET CIRCUIT

BACKGROUND OF THE INVENTION

In integrated circuits, and particularly in micro-logic circuits, there is often the necessity of integrating therewith specific circuits capable of ensuring the resetting of all of the functional elements of the integrated circuit to a certain state whenever power is switched on. This resetting must occur independently of the manner in which the supply voltage is raised from ground potential to the nominal supply voltage level, in order to prevent the occurrence of undesired and uncontemplated integrated circuit element configurations, which may cause malfunctioning and possibly latching of the whole integrated circuit device.

Such circuits are called power-on reset circuits, and are commonly referred to by the acronym POR. POR circuits perform the aforementioned function. These circuits are capable of generating a resetting pulse of predetermined characteristics upon switching on of the integrated circuit (i.e. when power is provided by a supply voltage).

Generally, these POR circuits have an architecture which includes power dissapative static current paths between the potential voltage nodes and, although these static current paths normally have a relatively high impedance, the persistence of a nonnegligeable static power consumption is not, in many cases, compatible with design specifications of CMOS integrated circuit devices, which typically have a null static consumption Therefore, these POR circuits may not be usable with many CMOS integrated circuit devices.

In addition, these POR circuits may internally cause malfunctioning if accidentally stimulated by internal or external transient events, e.g. noise induced by the switching of output buffers and the like.

OBJECT AND SUMMARY OF THE INVENTION

A main object of the present invention is to provide a power-on reset circuit (POR) having a null static power consumption and which is particularly insensitive to improper stimuli.

This object and other advantages are achieved by the circuit of the present invention which is characterized by having a null static power consumption and an outstanding immunity to noise. Essentially the circuit comprises first and a second inverters; connected in cascade, the output of the second inverter representing the output of the reset circuit. The interconnection node between the two inverters is capacitively coupled to ground potential while the input node of the first inverter is capacitively coupled to the supply voltage. A first switch, driven by the voltage potential actually present on the interconnection node between the two inverters, is functionally connected between the input node of the first inverter and the supply voltage rail. A second switch is functionally connected between the input node of the first inverter and ground potential. This second switch has a control terminal to which a driving signal is fed. This driving signal is tapped from a biasing line which is connected to the supply voltage rail and which comprises at least two forward biased transistor junctions connected in series, one transistor of which is connected to a node which is capacitively coupled to ground potential. The node of the biasing line capacitively coupled to ground may be functionally connected to a control terminal of the second switch for determining states of conduction or of interdiction.

The two forward biased and series-connected junctions of the biasing line may be realized through use of two diodes functionally connected in series with the intermediate connection node between the two series-connected diodes also capacitively coupled to ground potential.

In addition, a discharge switch, controlled by the supply voltage rail may be connected between the node of the biasing line, which is capacitively coupled to ground potential, and ground potential in order to quickly reset to ground potential the node controlling the second switch upon switching off of the power supply to the integrated circuit.

A third switch may be connected between the intermediate connection node of the biasing line and a control terminal of the second switch. This third switch is driven by the signal present on the interconnection node between the two inverters, thus implementing, at the instant the first inverter is triggered, a feedback loop which accelerates the discharge of the voltage present on the input node of the first inverter toward ground potential through the second switch. This discharge occurs by increasing the voltage potential present on the control node of the second switch toward the voltage potential of the intermediate connection node of the biasing line, thereby eliminating the effect fo the threshold voltage of the second diode of the biasing line.

BRIEF DESCRIPTION OF THE DRAWINGS

The different aspects and advantage will become more evident through the following description of a preferred embodiment and references to the annexed drawings, wherein.

DETAILED DESCRIPTION

Figure 1:
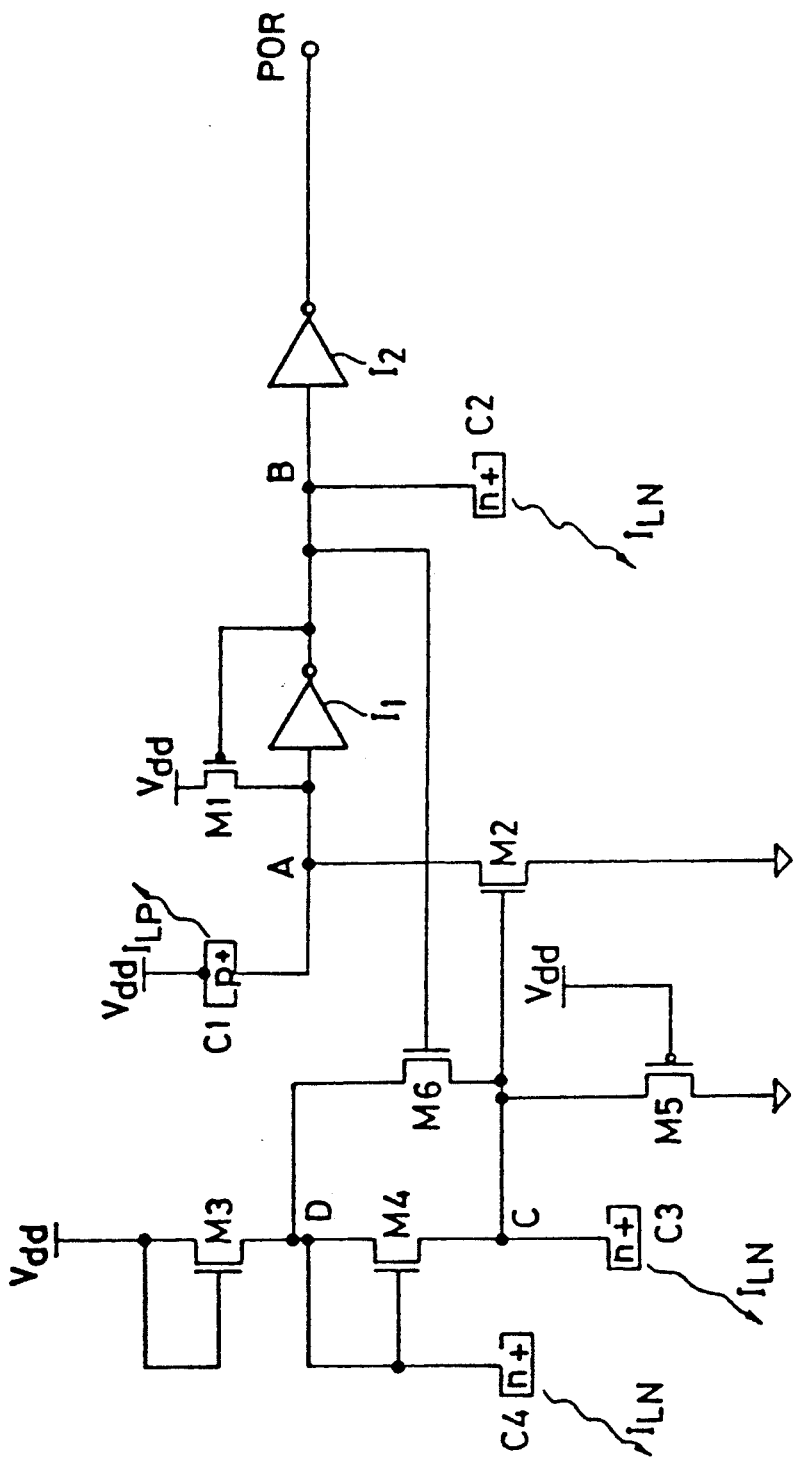
FIG. 1 is a circuit diagram of a power-on reset circuit of the invention.

With reference to FIG. 1, the circuit of the invention, being readily integratable in a CMOS integrated circuit device, comprises two inverters I1 and I2 connected in cascade. The circuit delivers a desired reset signal through output node POR, upon the switching on of the power to the integrated circuit. The input node A of the first inverter I1 is capacitively coupled to the supply voltage rail $V_{dd}$ of the circuit through an integrated capacitor C1, which may be realized by performing P-type diffusion in an N-type well region which is electrically connected to the supply voltage rail $V_{dd}$. The intermediate connection node B between the two inverters is capacitively coupled to ground through use of an integrated capacitor C2, which may be realized by performing N-type diffusion in a P-type substrate of an integrated circuit which is electrically connected to ground potential. A first switch M1, which may be realized through use of a P-channel MOS transistor, is driven by the signal present on node B and is functionally connected between input node A of the first inverter I1 and the supply voltage rail $V_{dd}$. A second switch M2, which may be realized through use of an N-channel MOS transistor, is functionally connected between input node A of the first inverter I1 and ground potential, and is driven by a driving signal derived from node C. Node C, being capacitively coupled to ground potential, is on a biasing line which is connected to the supply voltage rail $V_{dd}$, and which comprises at least two diodes, or two forward biased transistor junctions, connected in series. These diodes may be realized through use of two diode-configured N-channel MOS transistors M3 and M4. Both node C and intermediate node D of the biasing line are capacitively coupled to ground potential through respective integrated capacitors C3 and C4. Integrated capacitors C3 and C4 may be realized by forming N-type diffusions in P-type substrates of integrated circuits, which are connected to ground potential.

A third switch M5 is preferably connected between node C of the biasing line, notably from where the signal driving the M2 switch is derived, and ground potential. This third switch is driven by the supply voltage $V_{dd}$ and is used for discharging the voltage present on the node C upon the switching off of the power; i.e. when the supply voltage $V_{dd}$ drops below the voltage potential of the node C. In the example shown in FIG. 1, such a switch M5 is realized by a P-channel transistor whose control terminal is connected to the supply voltage rail $V_{dd}$ of the circuit.

The circuit may also advantageously be provided with a feedback loop constituted by a fifth switch M6 which is functionally connected between nodes D and C of the biasing line and which is driven by the signal present on interconnection node B. As shown, this fifth switch M6 may be realized by an N-channel MOS transistor.

Figure 2:
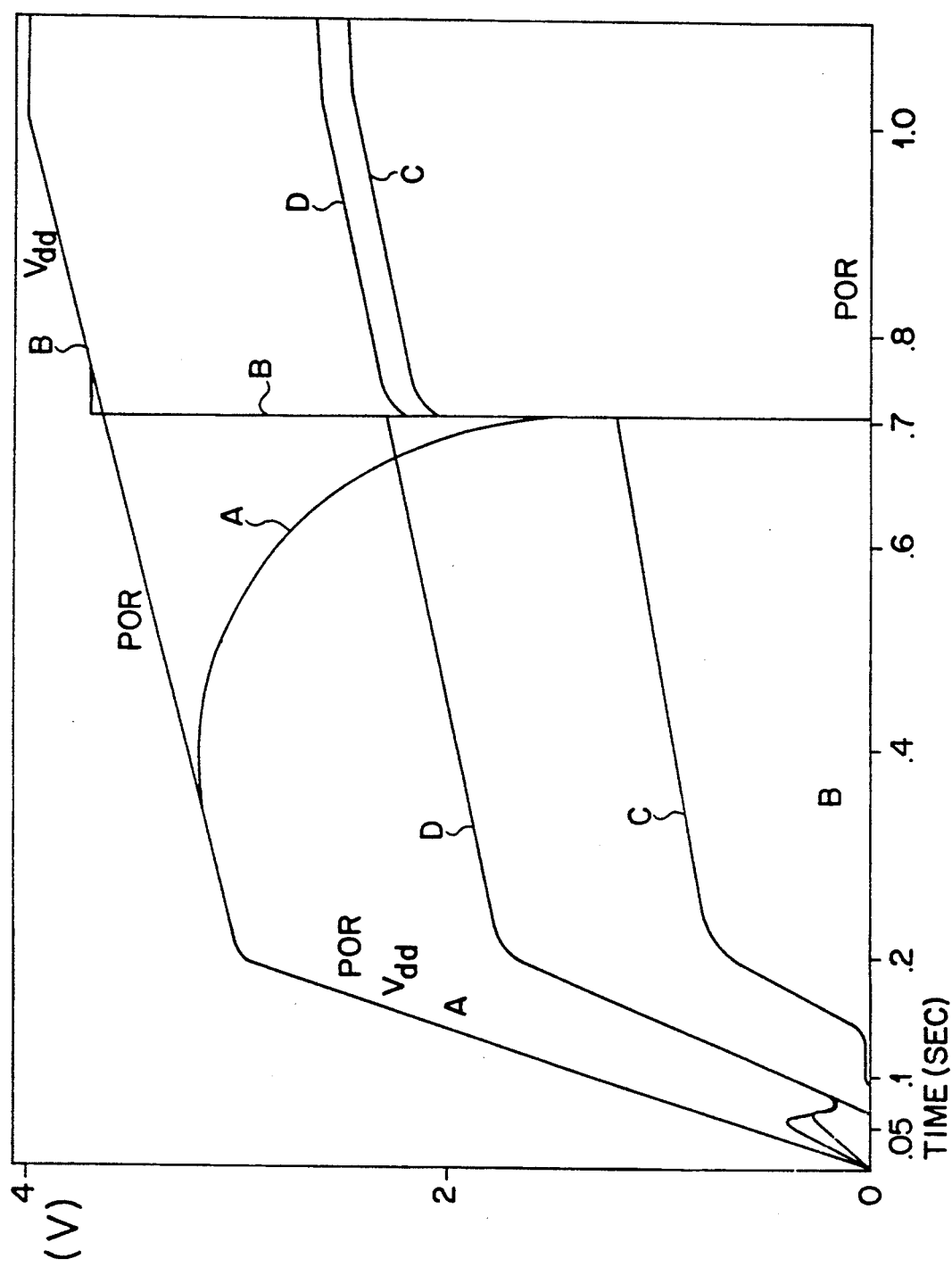
FIG. 2 is a diagram showing the operating voltage characteristics of the significant nodes of the circuit of FIG. 1 relative to the supply voltage.

The operation of the circuit as described below with reference to both FIGS. 1 and 2.

Before the power-on instant (when power is provided to the circuit), all of the circuit nodes are at ground potential and all of the circuit elements are in an "OFF" state. This is illustrated at time 0 in FIG. 2.

Upon switching on power, nodes D, C and B initially continue to be maintained at ground potential because of their strong capacitive coupling with ground potential; this phenomena is also influenced by the natural current leakage toward ground potential, schematically indicated in FIG. 1 by the arrows $I_{LN}$, which current leakage is normally present in an N-type junction formed in a P-type substrate which is connected to ground.

Unlike nodes B, C, and D, node A follows the rise of the supply voltage $V_{dd}$ because of the strong capacitive coupling of node A with the supply rail $V_{dd}$. This can be seen in FIG. 2 between 0 and 0.05 seconds where nodes B, C, and D are at 0 volts (ground potential) and node A is rising with the supply voltage $V_{dd}$. This voltage-rise following behavior is also influenced by the natural current leakage toward the supply rail, schematically indicated in FIG. 1 by the arrow $I_{LP}$, which current leakage is generally intrinsically present in a P-type junction formed in an N-type well region connected to the supply voltage rail. This behavior is further influenced by the subsequent establishment of an active current path to the supply rail $V_{dd}$ through the P-channel transistor M1.

After such a first brief capacitance charging phase, with a further rise in the supply voltage $V_{dd}$ toward the desired value, nodes D and C of the biasing line begin to follow the supply voltage $V_{dd}$, each node at a certain "distance" from the actual supply voltage $V_{dd}$ due to the threshold voltages of the diode-connected transistors M3 and M4. This can be seen in FIG. 2 between 0.1 and 0.2 seconds where the potential voltage on nodes C and D are rising but are not as high as the supply voltage $V_{dd}$.

When the voltage potential of node C rises beyond the threshold voltage of the N-channel transistor M2, a discharge path toward ground is created for the voltage potential present on input node A of the first inverter I1. The rise of the node C voltage potential causes, upon the switching on of the M2 transistor, a progressive drop in the voltage potential of input node A from the voltage level previously reached through the capacitive coupling provided by the capacitor C1 during the first charging phase and subsequently through the active current path provided by the M1 transistor. The discharge in the voltage potential of node A can be seen between 0.4 and 0.7 seconds in FIG. 2. When the dropping voltage potential on node A reaches the triggering voltage level of the inverter I1, the inverter I1 is triggered. The triggering of inverter I1 brings its output node voltage potential, i.e. node B of the circuit, to the full value of the supply voltage $V_{dd}$, which determines the ending of resetting pulse POR, which had been provided until that moment by the circuit through its output terminal. This can be seen in FIG. 2 at about 0.7 seconds.

The POR pulse, which from the power-on instant follows the actual voltage rise of the supply voltage $V_{dd}$, switches to ground potential when inverter I1 is triggered, thus terminating its action on the integrated circuits included in the semiconductor device with which the present circuit is utilized.

The increase in the voltage potential of node B to the supply rail voltage $V_{dd}$, through the triggering of inverter I1, suddenly increases the voltage potential of node C of the biasing line, thus enhancing the conditions which lead to the absent POR pulse configuration. This increase in the node C voltage potential can be seen between 0.7 and 1–0 seconds in FIG. 2. The enhanced conditions include protection against the occurrence of spurious signals triggering the generation of an undesirable POR signal, as described below.

The increase in voltage potential of node B, working through transistor M6, causes the increase in voltage potential of node C and substantially eliminates the effect on the node C voltage potential of the threshold voltage of transistor M4. The turning on of transistor M6 creates a "feedback" path. This node C potential voltage control confers to the circuit an outstanding immunity against possible "rebounds" on the supply voltage rail and/or internal noise. This effectively prevents the occurrence of spurious POR pulses which could otherwise take place as a consequence of an accidental drop of voltage potential of node C below the threshold voltage level of the M2 transistor.

The triggering voltage level necessary for production of the POR signal may be easily preestablished at the design stage of the circuit by a relative dimensioning of the M1 and M2 transistors (i.e., coordinating the voltages necessary to turn on the transistors).

Transistor M5 permits the voltage potential of node C to quickly discharge and, therefore, also node D when the supply voltage $V_{dd}$ drops below the potential voltage reached by node C. This quick discharging accelerates resetting after switching off the integrated circuit. In practice, transistor M5 may also be substituted by a diode, e.g. an N/P-type well/junction having the D type junction connected to node C and the N-type well connected to the supply voltage rail $V_{dd}$. The action performed by a diode would be identical to that performed by transistor M5, as described above.

It is to be appreciated that the N and P diffusions used to realize capacitors C1, C2, C3 and C4 should have an area sufficiently large for establishing strong capacitive coupling and for causing relatively high leakage currents in order to optimize the operating conditions of the circuit.

Many modifications and variations of the specific circuit elements and parameters are possible in light of the above teachings. The specific parameters mentioned are not intended as limiting, but are meant to be exemplary. Those skilled in the art will readily appreciate that all such parameters will depend on the application. It is, therefore, to be understood that within the scope of the appended claims and equivalents thereto, the invention may be practiced otherwise than as specifically described.

What is claimed is:

1. A power-on reset circuit for an integrated circuit, whereupon provision of a supply voltage to the integrated circuit, the power-on reset circuit provides a reset signal which tracks the supply voltage up to a predetermined voltage level and then drops to ground potential, the power-on reset circuit comprising:
   a first inverter connected between an input node and an interconnection node, wherein the input node is capacitively coupled to the supply voltage, and the interconnection node is capacitively coupled to ground potential;
   a second inverter connected between the interconnection node and an output node, wherein the output node provides the reset signal;
   a first switch coupled to the input node of the first inverter and the supply voltage, and responsive to a signal on the interconnection node;
   a biasing line connected to the supply voltage at one end and having a driving node at the other end which driving node is capacitively coupled to ground potential, the biasing line having two series-connected transistor junctions between the ends; and
   a second switch coupled to the input node of the first inverter and ground potential, and responsive to a signal on the driving node.

2. A power-on reset circuit as claimed in claim 1, wherein the two series-connected transistor junctions are forward biased.

3. A power-on reset circuit as claimed in claim 1, further including a third switch coupled to the driving node and ground potential, and responsive to the supply voltage.

4. A power-on reset circuit as claimed in claim 1, wherein the integrated circuit has a P-type substrate connected to ground potential.

5. A power-on reset circuit as claimed in claim 1, wherein the second switch includes an N-channel MOS transistor.

6. A power-on reset circuit as claimed in claim 1, wherein the first switch includes a P-channel MOS transistor.

7. A power-on reset circuit as claimed in claim 2, wherein the two forward biased junctions include two diodes connected in series, the two diodes having an intermediate node between them, wherein the intermediate node is capacitively coupled to ground potential.

8. A power-on reset circuit as claimed in claim 4, further including a fourth switch coupled to the intermediate node and the driving node, and responsive to a signal on the interconnection node, the fourth switch providing a feedback path such that upon triggering the first inverter, the second switch is turned on allowing the signal on the input node of the first inverter to discharge toward ground potential through the second switch, thereby raising the voltage level of the signal on the driving node.

9. A power-on reset circuit as claimed in claim 3, wherein the third switch includes a P-channel MOS transistor capable of conducting when the supply voltage falls below the voltage level of the signal on the driving node.

10. A power-on reset circuit as claimed in claim 4, wherein the capacitive coupling to the supply voltage of the input node is realized through use of an integrated capacitor of P-type diffusion/N-type well region, wherein the N-type well region is connected to the supply voltage.

11. A power-on reset circuit as claimed in claim 4, wherein the capacitive couplings to ground potential of the interconnection node and the driving node are realized through use of integrated capacitors of N-type diffusion/P-type substrate.

12. A power-on reset circuit as claimed in claim 7, wherein the two diodes include two N-channel MOS transistors.

13. A power-on reset circuit as claimed in claim 8, wherein the fourth switch includes an N-channel MOS transistor.

14. A power-on reset circuit for an integrated circuit, whereupon provision of a supply voltage to the integrated circuit, the power-on reset circuit provides a reset signal which tracks the supply voltage up to a predetermined voltage level and then drops to ground potential, the power-on reset circuit comprising:
   a first means for inverting an electronic signal connected between an input node and an interconnection node, wherein the input node is capacitively coupled to the supply voltage, and the interconnection node is capacitively coupled to ground potential;
   a second means for inverting an electronic signal connected between the interconnection node and an output node, wherein the output node provides the reset signal;
   a first means for electronic switching coupled to the input node of the first inverter and the supply voltage, and responsive to a signal on the interconnection node;
   a driving node capacitively coupled to ground potential;
   means for connecting the supply voltage to the driving node, said connecting means including two series-connected transistor junctions; and
   a second means for electronic switching coupled to the input node of the first inverter and ground potential, and responsive to a signal on the driving node.

15. A power-on reset circuit as claimed in claim 14, wherein the two series-connected transistor junctions are forward biased.

16. A power-on reset circuit as claimed in claim 14, further including a third means for electronic switching coupled to the driving node and ground potential, and responsive to the supply voltage.

17. A power-on reset circuit as claimed in claim 14, wherein the integrated circuit has a P-type substrate connected to ground potential;

wherein the capacitive coupling to the supply voltage of the input node is realized through use of an integrated capacitor of P-type diffusion/N-type well region, and wherein the N-type well region is connected to the supply voltage; and wherein the capacitive couplings to ground potential of the interconnection node and the driving node are realized through use of integrated capacitors of N-type diffusion/P-type substrate.

18. A power-on reset circuit as claimed in claim 14, wherein the second switching means includes an N-channel MOS transistor and wherein the first switching means includes a P-channel MOS transistor.

19. A power-on reset circuit as claimed in claim 15, wherein the two forward biased junctions include two diodes connected in series, the two diodes having an intermediate node between them, wherein the intermediate node is capacitively coupled to ground potential.

20. A power-on reset circuit as claimed in claim 16, further including a fourth means for electronic switching coupled to the intermediate node and the driving node, and responsive to a signal on the interconnection node, the fourth means for electronic switching providing a feedback path such that upon triggering the first inverter means, the second means for electronic switching is turned on allowing the signal on the input node of the first inverting means to discharge toward ground potential through the second means for electronic switching, thereby raising the voltage level of the signal on the driving node.

21. A power-on reset circuit as claimed in claim 16, wherein the third switching means includes a P-channel MOS transistor capable of conducting when the supply voltage falls below the voltage level of the signal on the driving node.

22. A power-on reset circuit as claimed in claim 19, wherein the two diodes include two N-channel MOS transistors.

23. A power-on reset circuit as claimed in claim 18, wherein the fourth switching means includes an N-channel MOS transistor.

24. An integrated circuit system comprising:
at least one integrated circuit powered by a supply voltage; and
a power-on reset circuit which, upon provision of the supply voltage to the integrated circuit, provides a reset signal which tracks the supply voltage up to a predetermined voltage level and then drops to ground potential, wherein the power-on reset circuit includes:
a first inverter connected between an input node and an interconnection node, wherein the input node is capacitively coupled to the supply voltage, and the interconnection node is capacitively coupled to ground potential;
a second inverter connected between the interconnection node and an output node, wherein the output node provides the reset signal;
a first switch coupled to the input node of the first inverter and the supply voltage, and responsive to a signal on the interconnection node;
a biasing line connected to the supply voltage at one end and having a driving node at the other end which driving node is capacitively coupled to ground potential, the biasing line having two series-connected transistor junctions between the ends; and
a second switch coupled to the input node of the first inverter and ground potential, and responsive to a signal on the driving node.

25. A power-on reset circuit for an integrated circuit, whereupon provision of a supply voltage to the integrated circuit, the power-on reset circuit provides a reset signal which tracks the supply voltage up to a predetermined voltage level and then drops to ground potential, the power-on reset circuit comprising:
an inverting circuit coupled to both the supply voltage and ground potential, and having an input voltage and an output which provides the reset signal;
a biasing line coupled to both the supply voltage and ground potential, and having a plurality of nodes at different voltage levels, the biasing line having only a leakage current flowing therethrough; and
a multiple switch network operatively connected between the inverting circuit and the biasing line, wherein the multiple switch network, in response to at least one of the biasing line voltages, provides a path for the input voltage of the inverting circuit to discharge.

26. A power-on reset circuit as claimed in claim 25 wherein the coupling to both the supply voltage and ground potential of the inverting circuit and the coupling to ground of the biasing line includes capacitive coupling.

27. A power-on reset circuit as claimed in claim 26 wherein the multiple switch network includes two switches.

28. A power-on reset circuit as claimed in claim 26 wherein the multiple switch network includes four switches.

29. A power-on reset circuit for an integrated circuit, whereupon provision of a supply voltage to the integrated circuit, the power-on reset circuit provides a reset signal which tracks the supply voltage up to a predetermined voltage level and then drops to ground potential, the power-on reset circuit comprising:
first and second inverting circuits connected in cascade, the first inverting circuit having an input capacitively coupled to the supply voltage, the second inverting circuit having an input capacitively coupled to ground potential and having an output which provides the reset signal;
a biasing line comprising a plurality of reverse-biased integrated diodes connected in series, the biasing line being connected to the supply voltage and capacitively coupled to ground potential, and having a plurality of nodes at different voltage levels; and
a multiple switch network operatively connected between the cascade-connected inverting circuits and the biasing line, wherein the multiple switch network, in response to at least one of the different voltage levels of the biasing line, provides a path for the input of the first inverting circuit to discharge.

30. A power-on reset circuit for an integrated circuit comprising:
an inverting circuit coupled to both a supply voltage and ground potential, and having an input voltage and an output which provides a reset signal;
a biasing line coupled to both the supply voltage and ground potential, and having a plurality of nodes at different voltage levels, the biasing line having only a leakage current flowing therethrough;

a multiple switch network operatively connected between the inverting circuit and the biasing line, wherein the multiple switch network, in response to at least one of the biasing line voltages, provides a path for the input voltage of the inverting circuit to discharge; and wherein the power-on reset circuit provides a reset signal which tracks the supply voltage up to a predetermined voltage level and then drops to ground potential.

31. A power-on reset circuit as claimed in claim 30 wherein the reset signal positively terminates before the supply voltage reaches a steady state level.

32. A power-on reset circuit as claimed in claim 30 further comprising means for incrementing leakage currents flowing through the power-on reset circuit.

* * * * *